(12) United States Patent
Ohyanagi et al.

(10) Patent No.: US 7,067,878 B2
(45) Date of Patent: Jun. 27, 2006

(54) FIELD EFFECT TRANSISTOR

(75) Inventors: Takasumi Ohyanagi, Hitachi (JP);
Atsuo Watanabe, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 213 days.

(21) Appl. No.: 09/964,809

(22) Filed: Sep. 28, 2001

(65) Prior Publication Data

US 2002/0125510 A1    Sep. 12, 2002

(30) Foreign Application Priority Data

Mar. 8, 2001    (JP)    ............................. 2001-064318

(51) Int. Cl.
*H01L 31/119*    (2006.01)

(52) U.S. Cl. ...................... 257/336; 257/361; 257/355; 257/335

(58) Field of Classification Search ..................... None
See application file for complete search history.

(56) References Cited

U.S. PATENT DOCUMENTS

| 5,438,215 A | 8/1995 | Tihanyi |
| 5,578,509 A | 11/1996 | Fujita |
| 5,594,264 A * | 1/1997 | Shirahata et al. ........... 257/335 |

FOREIGN PATENT DOCUMENTS

| JP | 04-241463 | 8/1992 |
| JP | A-05-110080 | 4/1993 |
| JP | 05-129602 | 5/1993 |
| JP | A-05-129602 | 5/1993 |
| JP | 06-021441 | 1/1994 |
| JP | 6-310717 | 11/1994 |
| JP | 7-007154 | 1/1995 |
| JP | A-07-086580 | 3/1995 |
| JP | A-11-121742 | 4/1999 |

OTHER PUBLICATIONS

IEDM 89, "Asymmetrical Halo Source GOLD drain (HS-GOLD) Deep Sub-half Micron n-MOSFET Design for Reliability and Performance" pp. 617-620.

* cited by examiner

*Primary Examiner*—Dung A. Le
(74) *Attorney, Agent, or Firm*—Antonelli, Terry, Stout and Kraus, LLP.

(57) ABSTRACT

A MOS field effect transistor. A field relaxation layer of a gate overlap structure is disposed in contact with a drain region for the purpose of relaxation of the electric field by increasing a distance between the field relaxation layer and a high-density layer. The electric field relaxation can further be promoted because the equipotential lines are bent by a gate insulation film. A punch-through stopper layer of a gate overlap structure is disposed in contact with a source region for suppressing spreading of a depletion layer toward the source region. The length of a gate electrode can be realized in a miniaturized size.

5 Claims, 7 Drawing Sheets

DISTANCE BETWEEN ENDS OF FIELD
RELAXATION LAYER AND HIGH-DENSITY LAYER [μm]

FIELD EFFECT TRANSISTOR

BACKGROUND OF THE INVENTION

1. Field of the Invention

The present invention relates to a MOS (Metal Oxide Semiconductor) field effect transistor whose blocking voltage appearing between a drain electrode and a substrate (between a drain electrode and a source electrode) is higher than 5 volts inclusive.

2. Description of Related Art

For implementing a flash memory or the like device which requires a voltage of about 10 volts or higher for memory cell write/erase operations, there are required MOS field effect transistors (MOSFETs) whose blocking voltage is on the order of 10 volts. In Japanese Patent Application Laid-Open Publication No. 8580/1995 (JP-A-7-8580), a MOS field effect transistor which exhibits a relatively high blocking voltage of about 30 volts and in which a high-density layer formed in contact with a drain electrode is disposed relative to a high-density layer formed in contact with the source electrode with interposition of an insulation film having a thickness greater than a gate insulation film.

Further, as the MOS field effect transistor having the blocking voltage in the range of about 10 to 30 volts, there are known those implemented in a so-called LDD (Lightly Doped Drain) structure in which an end of a high-density layer contacted to the drain electrode is disposed with a distance from an end of the gate insulation film with a view to ensuring a high blocking voltage.

It is further noted that in IEDM 89 (IEEE Electron Device Meeting 1989) p. 617, a MOS field effect transistor of such structure is disclosed in which an field relaxation layer and a punch-through stopper layer (halo-layer) each implanted in a gate overlap structure are disposed asymmetrically on the drain side and the source side, respectively.

However, with the hitherto known structures of the conventional MOS field effect transistors, implementation of the transistor in more minute or miniaturized structure has been considered practically difficult or impossible in respect to the blocking voltage to be ensured. Such being the circumstances, even though the memory cells trend to be further miniaturized, the spatial proportion which the MOS field effect transistors of high blocking voltage occupy in the flash memory as a whole is large, rendering it difficult to realize miniaturization of the memory chip.

At this juncture, it should be noted that in the case of the MOS transistor structure disclosed in IEDM 89 (IEEE Electron Device Meeting 1989) p. 617 mentioned above, the voltage to be handled is as low as on the order of 3.5 volts, and no consideration is paid to the handling of high blocking voltage on the order of 5 volts.

SUMMARY OF THE INVENTION

In the light of the state of the art described above, it is an object of the present invention to provide an improved structure of a MOS field effect transistor which can afford a high blocking voltage with a significantly miniaturized structure.

Another object of the present invention is to provide a method of manufacturing the MOS field effect transistor mentioned above.

In view of the above and other objects which will become apparent as the description proceeds, there is provided according to an aspect of the present invention a MOS field effect transistor which includes a semiconductor substrate of a first conductivity type, a gate insulation film formed on the semiconductor substrate, a gate electrode formed on the gate insulation film, a source region of a second conductivity type, and a drain region of the second conductivity type, wherein a field relaxation layer of the second conductivity type is provided in the drain region and beneath the gate insulation film in a so-called overlap structure. Incidentally, with the phrase "gate overlap structure", it is intended to mean that the field relaxation layer extends through or penetrates the semiconductor substrate from beneath an end of the gate insulation film in contact with the gate insulation film.

In the conventional MOS field effect transistor such as exemplified by an N-type channel MOS field effect transistor, the distance between the field relaxation layer and a high-density layer deposited in contact with the drain electrode represents a major factor which determines the blocking voltage. More specifically, when a voltage is applied to the drain electrode, a depletion layer ascribable to a PN junction formed between the field relaxation layer of the second conductivity type and the semiconductor substrate of the first conductivity type spreads to reach the high-density layer of the second conductivity type, as a result of which the field intensity at an end of the high-density layer increases, bringing about an avalanche breakdown.

By contrast, in the MOS field effect transistor according to the present invention, the distance between the field relaxation layer and the high-density layer can be increased without being accompanied with enlargement in size of the device, whereby the blocking voltage can be increased, which in turn means that for a same blocking voltage, the gate length L can be realized minutely or shortened.

In the MOS field effect transistor according to another aspect of the present invention, a punch-through stopper layer is provided on the source side. The depletion layer formed between the field relaxation layer and the substrate spreads upon application of the drain voltage, as mentioned above. When the gate length L is shortened, the depletion layer reaches the layer end of the high-density layer on the source side before reaching that of the high-density layer on the drain side, which results in occurrence of a phenomenon called "punch-through". The blocking voltage is determined by this punch-through phenomenon. Accordingly, the punch-through stopper layer is provided on the source side with a view to suppressing the depletion layer from spreading to the high-density layer on the source side. By virtue of this feature, the gate length can be realized minutely or miniaturized in the MOS field effect transistor according to the present invention.

In the MOS field effect transistor according to the present invention, the high-density layers which are in contact with the source electrode and the drain electrode, respectively, are out of contact with the gate insulation film, which means nothing but the high-density layer is disposed with a given distance from the gate insulation film. By virtue of this feature, the distance between the field relaxation layer and the high-density layer can further be increased with the voltage directly applied to the gate insulation film can be relaxed or buffered.

More specifically, in the conventional MOS transistor structure disclosed in IEDM mentioned previously, the high-density layers are in contact with the gate insulation film. Consequently, when the drain voltage is e.g. 10 volts with the gate electrode being zero volt, the voltage of 10 volts is directly applied across the gate insulation film. Accordingly, the gate insulation film must necessarily be realized in a thickness which is capable of withstanding the voltage of 10 volts. However, when the gate insulation film is formed in the thickness mentioned above, the threshold voltage of the MOS field effect transistor will then increase, which incurs degradation of the performance of the MOS field effect transistor.

In the MOS field effect transistor according to the present invention, the high-density layer is not placed in contact with the gate insulation film. Accordingly, there arises no necessity of increasing the thickness of the gate insulation film, differing from the conventional MOS field effect transistor, and thus the MOS field effect transistor according to the present invention can be protected against degradation of the performance. Thus, according to the present invention, there is realized the MOS field effect transistor which can afford the blocking voltage ranging from 5 to 15 volts and which can thus advantageously be incorporated in the flash memory.

In the MOS field effect transistor according to the present invention, an insulation film is deposited over the whole surface after having formed the gate electrode, whereon the high-density layers are deposited by using as a mask the side walls of the gate electrode formed by etch-back process such as anisotropical dry etching method. Consequently, there arises no problem concerning the distance between the field relaxation layer and the high-density layer while the high-density layers which are in contact with the source electrode and the drain electrode, respectively, can be disposed symmetrically relative to the gate electrode. Thus, a high blocking voltage can be assured without increasing the size of the device.

The teachings of the present invention can advantageously be applied to the implementation of the MOS field effect transistor whose blocking voltage lies in the range of about 5 to 15 volts. However, in order to realize the MOS field effect transistor whose blocking voltage ranges from 15 to 30 volts or so, the present invention further teaches that the field relaxation layer mentioned previously is made to extend from beneath the end face of the gate insulation film toward the source electrode for a distance of 0.15 µm or more. In that case, not only the distance between the field relaxation layer and the high-density layer is increased but also the field intensity can further be relaxed by the gate insulation layer. Thus, the blocking voltage or breakdown strength can be enhanced. Besides, the gate length can be shortened moreover.

In the case of the MOS field effect transistor disclosed in IEDM mentioned previously, it is a prerequisite that the field relaxation layer is formed by resorting to an oblique ion implantation method according to which after formation of the gate electrode, ions are implanted with the gate electrode being used as a mask obliquely at an inclined beam angle in the range of 10° to 45° relative to a line normal to the surface of the substrate. This oblique ion implantation method is primarily used in manufacturing the MOS transistors having the gate length of not greater than 0.35 µm. With this implantation method, the field relaxation layer can not be extended toward the source electrode farther than ca. 0.1 µm from the end or edge of the gate insulation film even when the diffusion process is carried out in succession to the ion implantation.

FIG. 2 of the accompanying drawings is a view graphically illustrating relations between the distance intervening the field relaxation layer and the high-density layer and the blocking voltage. More specifically, change (ΔBV) of the blocking voltage is illustrated as a function of the distance between the field relaxation layer and the high-density layer, starting from the distance of zero, i.e., the state in which the field relaxation layer and the high-density layer overlap each other. In the figure, a solid line curve 1 represents the change of the blocking voltage when the field relaxation layer is extended from the source electrode from the end or edge of the gate insulation film with the high-density layer being fixedly positioned at the end face of the gate insulation film, while a broken line curve 2 represents the change of the blocking voltage when the high-density layer is distanced from the end of the gate insulation film with the field relaxation layer being fixedly positioned at the end face of the gate insulation film. As can be seen in FIG. 2, when the distance between the field relaxation layer and the high-density layer is 0.1 µm, difference between the curves 1 and 2 is negligible. However, when the distance of concern increases beyond 0.1 µm, the blocking voltage represented by the solid line curve 1 (i.e., when the field relaxation layer is increasingly extended beneath the gate electrode) becomes significantly higher than the blocking voltage represented by the broken line curve 2 (i.e., when the high-density layer is increasingly distanced from the gate insulation film). This may be explained by such phenomenon that the depletion layer formed between the field relaxation layer and the substrate is caused to spread upon application of the drain voltage with the voltage applied to the drain electrode being thus apportioned internally of the depletion layer. Equipotential lines extending out of the drain electrode are forced to bend remarkably on the surface of the substrate because the equipotential lines can not get out right above but extends through the drain electrode due to disposition of the gate insulation film on the field relaxation layer. Thus, the electric field is relaxed due to bending of the equipotential lines and the blocking voltage can increase significantly.

In the MOS field effect transistor according to another aspect of the present invention, the field relaxation layer is so formed as to overlap the gate electrode from the drain region side, while the punch-through stopper layer is formed to overlap the gate electrode from the source region side, and the high-density layers are distanced from the gate insulation film so as not to contact with the latter. Thus, the gate length can further be miniaturized. Furthermore, according to yet another aspect of the present invention, the field relaxation layer is extended from the end face of the gate insulation film toward the source electrode over a distance of 0.15 µm or more with the distance between the field relaxation layer and the high-density layer being increased while the electric field is relaxed by the gate insulation layer. Thus, not only the blocking voltage can be increased but also the gate length can be miniaturized.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which:

FIGS. 6A to 6G are views for illustrating a MOS field effect transistor manufacturing method according to a fifth embodiment of the present invention, wherein FIGS. 6A, 6B, 6C, 6D, 6E, 6F and 6G show individual steps, respectively, in the manufacturing method;

FIGS. 7A to 7G are views for illustrating a MOS field effect transistor manufacturing method according to a sixth embodiment of the present invention, wherein FIGS. 7A, 7B, 7C, 7D, 7E, 7F and 7G show individual steps, respectively, in the manufacturing method;

FIGS. 8A to 8D are views for illustrating a method of manufacturing a semiconductor device including MOS field effect transistors according to a seventh embodiment of the present invention, wherein FIGS. 8A, 8B, 8C and 8D show individual steps, respectively, in the manufacturing method.

DESCRIPTION OF THE EMBODIMENTS

Figure 1:
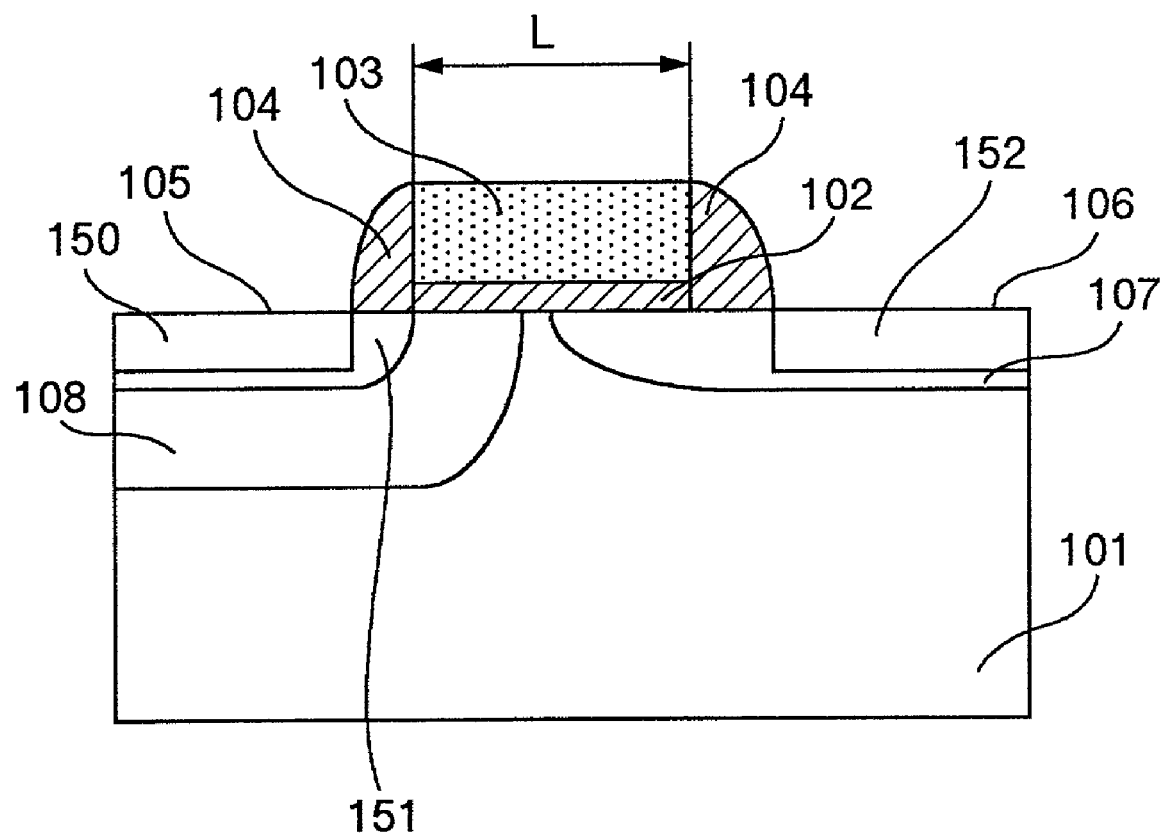
FIG. 1 is a sectional view showing a MOS (Metal Oxide Semiconductor) field effect transistor according to a first embodiment of the present invention.
Figure 2:
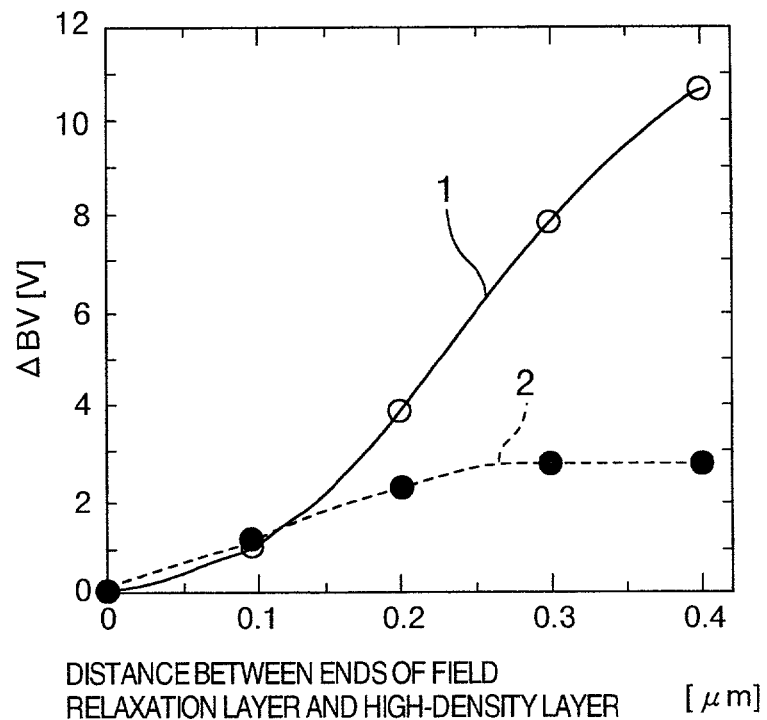
FIG. 2 is a view for graphically illustrating the effects obtained by disposing an field relaxation layer so that it extends or penetrates a semiconductor substrate beneath a gate insulation film in a MOS field effect transistor.

The present invention will be described in detail in conjunction with what is presently considered as preferred or typical embodiments thereof by reference to the drawings. In the following description, like reference characters designate like or corresponding parts throughout the several views.

Embodiment 1

FIG. 1 is a sectional view showing-an N-type channel MOS (Metal Oxide Semiconductor) field effect transistor according to a first embodiment of the present invention. As can be seen in FIG. 1, the field effect transistor according to the instant embodiment of the present invention includes a P-type silicon substrate or a P-type well region 101 formed in either a P-type silicon substrate or an N-type silicon substrate by implanting P-type impurity ions such as boron ions, wherein formed on the P-type well region 101 are a gate silicon oxide film (gate insulation film) 102, a gate electrode 103 implemented in a laminated structure film composed of an N-type polysilicon layer doped with phosphorus and a tungsten silicide film, side walls 104 constituted by silicon oxide films formed on lateral surfaces, respectively, of the gate electrode 103, a source region 105 constituted by a high-density N-type layer ($N^+$-layer) 150 formed in contact with either one of the side walls 104 and doped with e.g. arsenic or the like and a low-density N-type layer ($N^-$layer) 151 formed between the high-density N-type layer 150 and the gate insulation film 102 and having a lower density than the high-density N-type layer 150, and a drain region 106 constituted by a high-density N-type layer ($N^+$-layer) 152 formed by doping arsenic or the like in contact with the other one of the side walls 104 which is located oppositely to the side wall 104 contacted to the source region 105. Additionally, the field effect transistor includes a punch-through stopper layer 108 constituted by a P-type impurity layer which is doped with boron or the like and formed in a gate overlap structure in contact with the gate insulation film 102 at a location deeper than the high-density N-type layer ($N^+$-layer) 150 forming a part of the source region 105, and a field relaxation layer 107 of N-type impurity which is doped with phosphorus, arsenic or the like and formed in a gate overlap structure in contact with the gate silicon oxide film 102. Incidentally, in FIG. 1, reference character L designates the length of the gate (also referred to as the gate length).

In the N-type channel MOS field effect transistor according to the instant embodiment of the invention, a depletion layer extends between the field relaxation layer 107 of the gate overlap structure and the $N^+$-layer 152 which is contacted to the side wall 104 formed on the lateral surface of the gate electrode. However, by providing the punch-through stopper layer 108 as described above, spreading of the depletion layer toward the source region can be suppressed, whereby the blocking voltage (or breakdown voltage) of the N-type channel MOS field effect transistor can be enhanced. This in turn means that the gate length L can be implemented in a minute size.

At this juncture, it should be mentioned that although the P-type punch-through stopper layer 108 disposed beneath the gate silicon oxide film 102 is shown as being distanced from the N-type field relaxation layer 107 in FIG. 1, this is for the convenience of illustration. It should be understood that the punch-through stopper layer 108 and the N-type field relaxation layer 107 may be so formed as to be in contact with each other although it depends on the blocking voltage and the gate length of the MOS field effect transistor. Furthermore, although the N-type field relaxation layer 107 is shown in FIG. 1 as being formed deeper than the $N^+$-layer 152, the former may be formed shallower than the latter. Moreover, although the N-type field relaxation layer 107 is shown as being implemented in a single-layer structure, a layer corresponding to the $N^-$-layer 151 which constitutes a part of the source region 105 may additionally be provided for the field relaxation layer 107. In that case, the drain resistance can be reduced by a resistance presented by the above-mentioned $N^-$-layer.

In the instant embodiment, the teaching of the present invention is incarnated in the N-type channel MOS field effect transistor. It goes however without saying that the present invention can equally be applied to the P-type channel MOS field effect transistor by reversing the conduction type.

Embodiment 2

Figure 3:
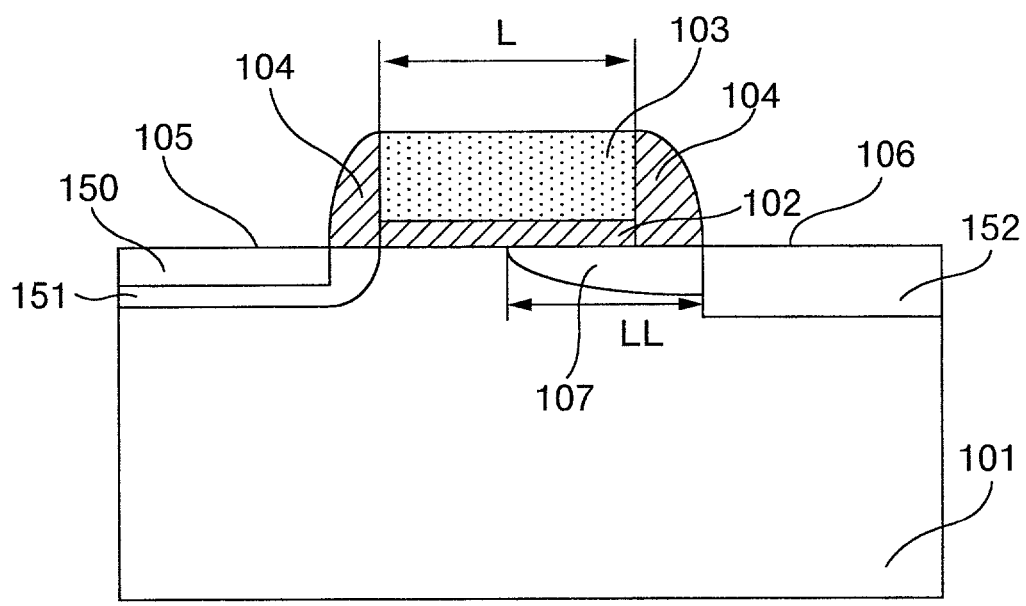
FIG. 3 is a sectional view showing a MOS field effect transistor according to a second embodiment of the present invention.

FIG. 3 is a sectional view showing an N-type channel MOS field effect transistor according to a second embodiment of the present invention. In the figure, like reference symbols as those used in FIG. 1 denote equivalent or corresponding parts. Referring to FIG. 3, the N-type channel MOS field effect transistor according to the instant embodiment of the invention includes, being formed in the P-type well region 101 similarly to the first embodiment of the invention, a gate silicon oxide film (gate insulation film) 102, a gate electrode 103, side walls 104 formed on lateral surfaces, respectively, of the gate electrode 103, a source region 105 constituted by a high-density N-type layer ($N^+$-layer) 150 formed in contact with one of the side walls 104 mentioned above and a low-density N-type layer ($N^-$-layer) 151 which is formed between the high-density N-type layer 150 and the gate insulation film 102 and which has a lower density than the high-density N-type layer 150, and a drain region 106 formed by a high-density N-type layer 152 which is in contact with the other side wall located oppositely to that contacted to the source region 105 mentioned above, wherein a field relaxation layer 107 doped with N-type impurity such as phosphorus, arsenic or the like penetrates or extends toward the source electrode beyond the outer end face of the side wall 104 over a distance of 0.15 μm or more. In FIG. 3, reference symbol LL denotes the distance for which the field relaxation layer extends from the outer end face of the side wall 104 toward the source electrode.

In the N-type channel MOS field effect transistor according to the instant embodiment of the invention, the field relaxation layer 107 penetrates or extends toward the source region beneath the gate insulation film 102 for a distance of 0.15 μm or more. By virtue of this feature, there can be obtained a field relaxation effect that the equipotential lines are caused to be bent or curved in addition to the field relaxation effect owing to the distance for which the field relaxation layer 107 and the drain region 106 formed of the high-density N-type layer 152 extend, as a result of which the blocking voltage of the N-type channel MOS field effect transistor can further be increased, i.e., voltage withstanding capability can further be enhanced. This in turn means that for a same blocking voltage, the gate length L can further be shortened.

Although the depth of the N-type field relaxation layer 107 is shown in FIG. 3 to be shallower than that of the $N^+$-layer 152, the former may be deeper or greater than the latter. Moreover, although the N-type field relaxation layer 107 is shown as being implemented in a single-layer structure, a layer corresponding to the $N^-$-layer 150 formed for the source region may additionally be provided in the field relaxation layer 107 to thereby reduce the drain resistance by a resistance presented by the $N^-$-layer.

Furthermore, by providing the punch-through stopper layer 108 in the source region 105 as in the case of the N-type channel MOS field effect transistor according to the first embodiment of the invention, spreading of the depletion layer can be suppressed, whereby the gate length can be implemented more minutely. Needless to say, the teaching of the invention incarnated in the second embodiment may equally be applied to the P-type channel MOS field effect transistor as in the case of the first embodiment of the invention.

Embodiment 3

Figure 4:
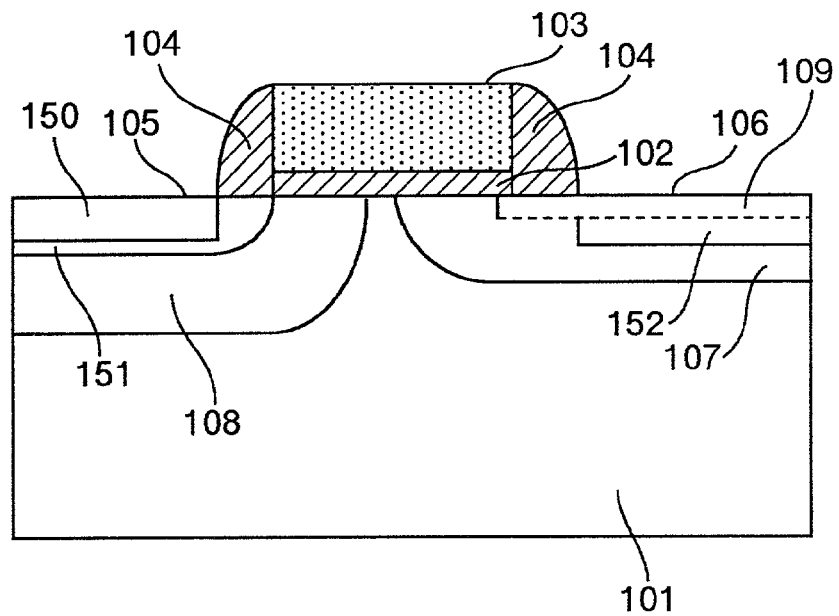
FIG. 4 is a sectional view showing a MOS field effect transistor according to a third embodiment of the present invention.

FIG. 4 is a sectional view showing an N-type channel MOS field effect transistor according to a third embodiment of the present invention. In the figure, like reference symbols as those used in FIG. 1 denote equivalent or corresponding parts.

The N-type channel MOS field effect transistor according to the third embodiment of the invention differs from the first embodiment in that a P-type impurity layer 109 is additionally formed by doping boron or the like in and along the surface of the drain region 106 of the N-type channel MOS field effect transistor according to the first embodiment. In the case of the N-type channel MOS field effect transistor according to the first embodiment, the high-density $N^+$-layer 152 is distanced from the gate insulation film 102 so that the voltage applied to the drain electrode is not directly applied to the gate insulation film 102. In this conjunction, it is noted that when the blocking voltage demanded for the device is to be set high, the voltage applied to the gate insulation film 102 becomes excessively high notwithstanding of the presence of the side walls 104. Besides, in some case, the thickness of the gate insulation film 102 can not be increased. In the N-type channel MOS field effect transistor according to the instant embodiment of the invention, the P-type impurity layer 109 is provided on the surface of at least either one of the field relaxation layer 107 for the gate insulation film 102 or the high-density $N^+$-layer 152 provided on the drain electrode side, to thereby form a depletion layer with a view to relaxing the electric field for thereby suppressing low the voltage applied to the end portion of the gate insulation film 102.

Incidentally, it should also be added that by applying the teaching of the invention incarnated in the instant embodiment to the MOS field effect transistor according to the second embodiment of the invention to form an impurity layer of the conductivity type opposite to that of the drain region on the surface of the drain region 106, to the substantially same effect. Besides, the teaching of the invention incarnated in the instant embodiment may equally be applied to the P-type channel MOS field effect transistor by reversing the conduction type.

Embodiment 4

Figure 5:
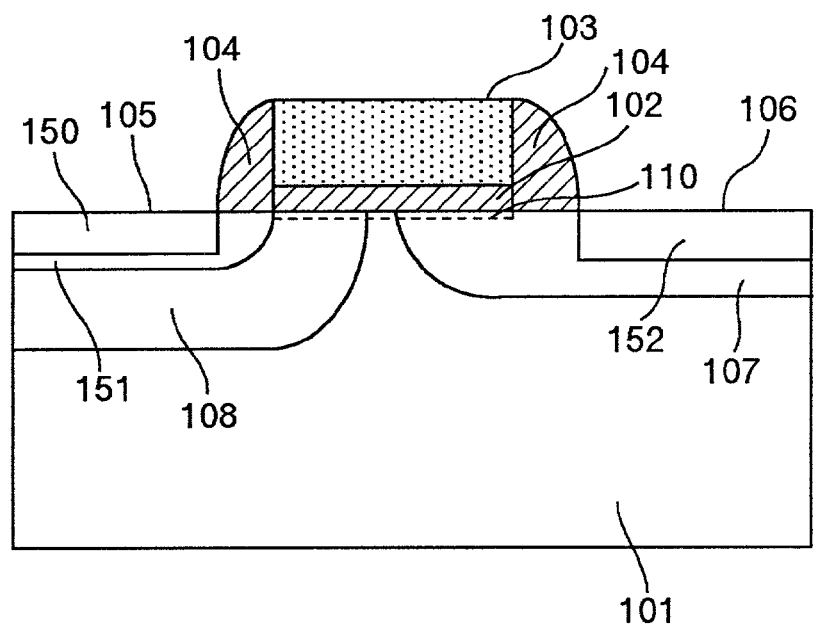
FIG. 5 is a sectional view showing a MOS field effect transistor according to a fourth embodiment of the present invention.

FIG. 5 is a sectional view showing an N-type channel MOS field effect transistor according to a fourth embodiment of the present invention. In the figure, like reference symbols as those used in FIGS. 1 to 4 denote equivalent or corresponding parts.

The MOS field effect transistor according to the instant embodiment of the invention includes, being formed on an N-type well region 101, a gate silicon oxide film (gate insulation film) 102, a gate electrode 103, side walls 104, a source region 105, and a drain region 106 constituted by a high-density P-type layer 152 formed in contact with the side wall 104 located oppositely to that which is in contact with the source region 105. In addition, the MOS field effect transistor now under consideration includes a punch-through stopper layer 108 constituted by an N-type impurity layer in a gate overlap structure, a field relaxation layer 107 doped with P-type impurity and implemented in a gate overlap structure in contact with the gate insulation film 102 and a P-type impurity layer 110 formed by doping boron or the like in the surface of the Si-substrate extending beneath the gate insulation film 102.

In the P-type channel MOS field effect transistor in which phosphorus is employed for the punch-through stopper, phosphorus is segregated in an interface between the gate insulation film 102 and the semiconductor substrate through a diffusion process carried out after the formation of the punch-through stopper layer 108, as a result of which such phenomenon makes appearance that the density of phosphorus remarkably increases at the boundary surface of the gate insulation film, rendering the threshold voltage high. For coping with such phenomenon, in the N-type channel MOS field effect transistor according to the instant embodiment of the invention in which $N^-$-layer polysilicon or the like is employed as the gate electrode, the surface of the semiconductor substrate is doped with P-type impurity, to thereby implement the P-type channel MOS field effect transistor in the form of a buried channel type MOS field effect transistor. With this structure, the threshold voltage can be adjusted to a desired value as well.

In the case of the instant embodiment of the invention, the P-type impurity layer 110 is formed in the surface of the Si-substrate extending beneath the gate insulation film 102 of the P-type channel MOS field effect transistor. In this conjunction, it should be added that in the case where the MOS field effect transistor described previously in conjunction with the second and third embodiments is implemented in the P-type channel MOS field effect transistor, the P-type impurity layer may be formed wholly or partially in the surface of the Si-substrate beneath the gate insulation film 102 to obtain the similar advantageous effect.

Furthermore, when the teaching of the invention incarnated in the instant embodiment is applied to the N-type channel MOS field effect transistor, the surface of the Si-substrate may be formed with the P-type impurity layer for thereby increasing the threshold voltage or contrarily doped with the N-type impurity layer for decreasing the surface density in appearance of the P-type layer to thereby lower the threshold voltage.

Embodiment 5

FIGS. 6A to 6F are views for illustrating stepwise a process or method of manufacturing the N-type channel MOS field effect transistor described hereinbefore in conjunction with the first embodiment of the invention. At first, in a step shown in FIG. 6A, a P-type silicon substrate is prepared or a P-type well region is formed by implanting P-type impurity ions such as boron ions into either a P-type silicon substrate or an N-type silicon substrate, which is then followed by deposition of photoresist 201. Thereafter, a window is opened over a predetermined region of the photoresist layer through a light exposure process, whereon N-type impurity ions 200 such as phosphorus ions, arsenic ions or the like are implanted into the predetermined region to thereby form an N-type impurity layer which is to serve as the field relaxation layer 107. Subsequently, the photoresist is removed.

Figure 6A:
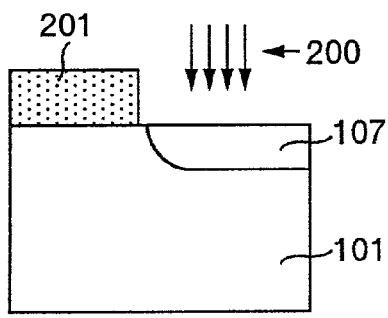
Figure 6D:
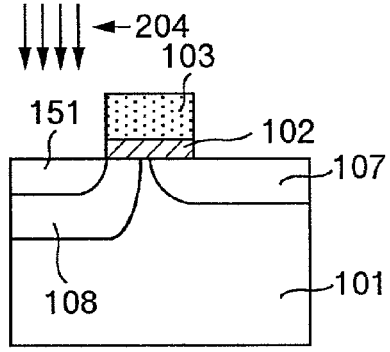
Figure 6B:
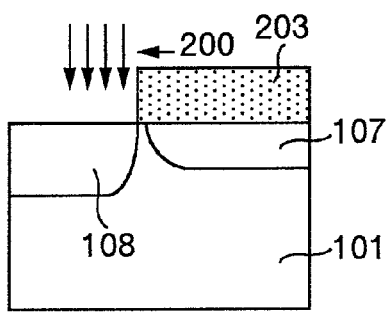

In succession, in a step shown in FIG. 6B, a photoresist layer 203 is deposited and then a window is formed over a predetermined region through an optical exposure process. Subsequently, P-type impurity ions 202 such as boron ions, $BF_2$ ions or the like are implanted into the predetermined region to thereby form a P-type impurity layer which is to serve as the punch-through stopper layer 108. Subsequently, the photoresist is removed.

Figure 6E:
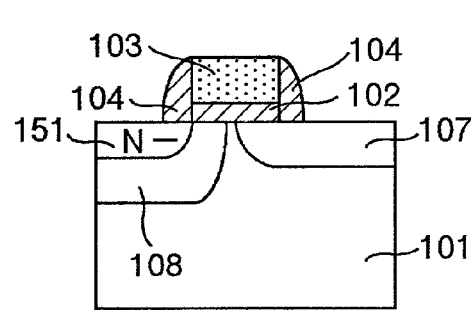
Figure 6C:
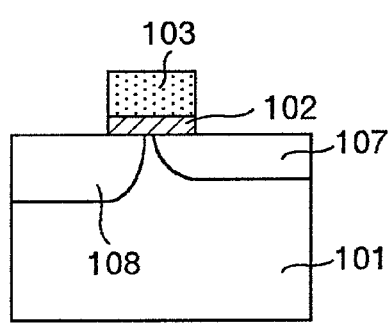

In a succeeding step shown in FIG. 6C, the gate silicon oxide film 102 and the gate electrode 103 are formed.

Next, in a step shown in FIG. 6D, N-type impurity ions 204 such as phosphorus ions are implanted with the gate electrode 103 being used as a mask to thereby form the N-type impurity layer 151.

At this juncture, although it has been described by reference to FIG. 6D that the N-type impurity ions 204 are implanted only in the portion which is destined finally to serve as the source region, it should be appreciated that the ion implantation may be so performed that the N-type impurity layer is formed over the whole surface of the substrate inclusive of the drain region through implantation of the N-type impurity ions 204.

Next, in a step shown in FIG. 6E, a silicon oxide film is deposited by a CVD (Chemical Vapor Deposition) or the like method, whereon etch-back treatment is performed by resorting to dry etching or the like process to thereby form the side walls 104 each of silicon oxide film on the lateral surfaces, respectively, of the gate electrode.

Figure 6F:
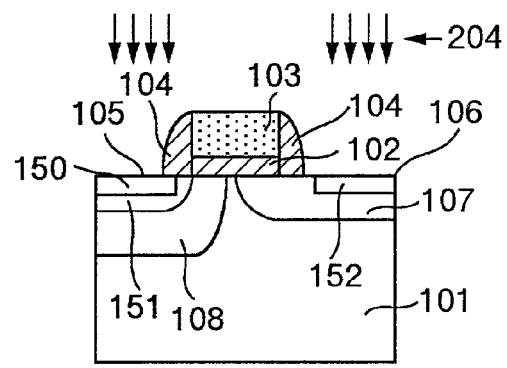

In a step shown in FIG. 6F, N-type impurity ions 204 such as arsenic ions are implanted to form the high-density N-type impurity layers 150 and 152, respectively.

In a step shown in FIG. 6G, an inter-layer insulation film 10 is deposited, whereon contact holes are formed and then metal films are deposited to be subsequently processed to thereby form a source electrode 11 and a drain electrode 12.

Figure 6G:
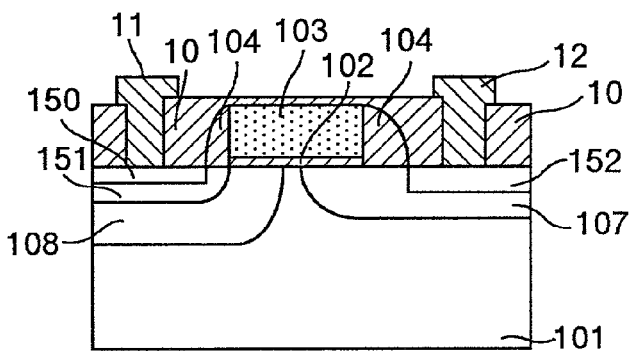

Incidentally, in FIG. 6G, contact between the gate electrode and the metal film is not shown. It should however be appreciated that one or more contact holes are formed at some location in the depthwise direction (i.e., direction orthogonal to the plane of FIG. 6G), and gate electrode is contacted to the metal film.

In the foregoing, description has been made of the method of manufacturing the N-type channel MOS field effect transistor. However, the P-type channel MOS field effect transistor can equally be manufactured by reversing the conductivity type.

Embodiment 6

FIGS. 7A to 7G are views illustrating stepwise another method of manufacturing the N-type channel MOS field effect transistor described hereinbefore in conjunction with the first embodiment of the present invention. In the first place, a P-type silicon substrate is prepared or alternatively a P-type well region 101 is formed in a P-type or N-type silicon substrate by implanting P-type impurity ions such as boron ions, which is then followed by formation of a gate silicon oxide film 102 and a gate electrode 103. See FIG. 7A.

Figure 7A:
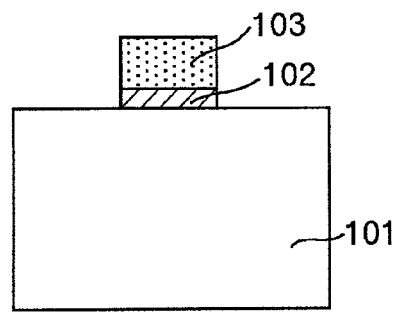
Figure 7B:
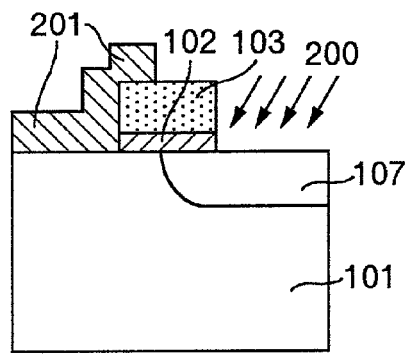

Subsequently, in a step shown in FIG. 7B, after deposition of photoresist 201, a window is opened over a predetermined region through light exposure process, whereon N-type impurity ions 200, e.g. phosphor ions, arsenic ions or the like, are implanted into the Si-substrate through an oblique ion implantation with the angle of incidence of 10° or more, preferably in the range of 0° to 45°, to thereby form a field relaxation layer 107 by causing the N-type impurity layer to penetrate or extend beneath the gate silicon oxide film 102.

Figure 7C:
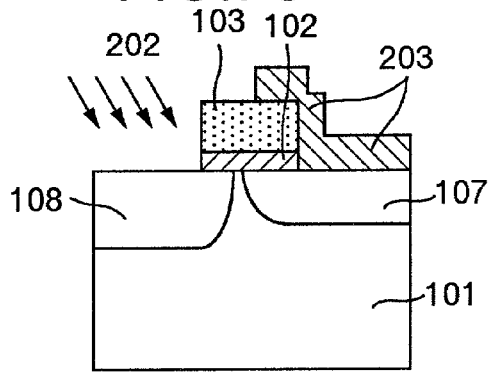

In succession, in a step illustrated in FIG. 7C, after deposition of photoresist 203, a window is opened over a predetermined region through a light exposure process, whereon P-type impurity ions 202 such as boron ions, $BF_2$ ions or the like are implanted into the Si-substrate through the oblique ion implantation with the angle of incidence of 10° or more, preferably in the range of 0° to 45°, to thereby form a punch-through stopper layer 108 by causing the P-type impurity layer to penetrate or extend beneath the gate silicon oxide film 102.

Figure 7D:
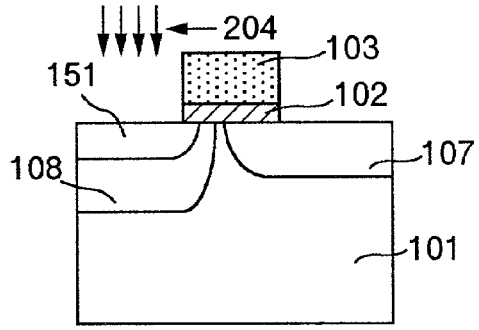

Next, in a step shown in FIG. 7D, N-type impurity ions 204 such as phosphorus ions, arsenic ions or the like are implanted into the silicon substrate to form an $N^-$-layer 151 of N-type impurity. At this juncture, although it is illustrated in FIG. 7D that the N-type impurity ions 204 are implanted only in the portion which is destined to finally serve as the source region, it should be appreciated that the ion implantation may be so performed that the N-type impurity layer is formed over the whole surface of the substrate inclusive of the drain region through implantation of the N-type impurity ions 204.

Figure 7E:
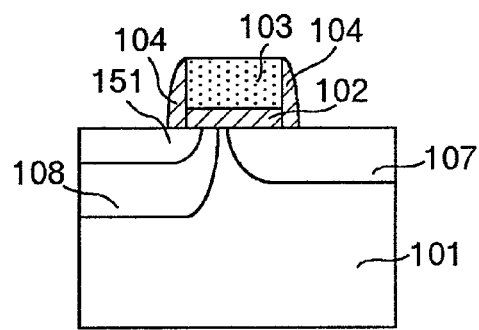

Next, in a step illustrated in FIG. 7E, a silicon oxide film is deposited by a CVD (Chemical Vapor Deposition) or the like method, whereon etch-back treatment is performed by resorting to dry etching or the like process to thereby form the side walls 104 each of a silicon oxide film on the lateral surfaces, respectively, of the gate electrode.

Figure 7F:
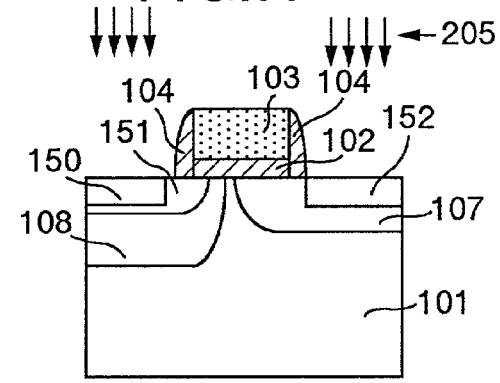
Figure 7G:
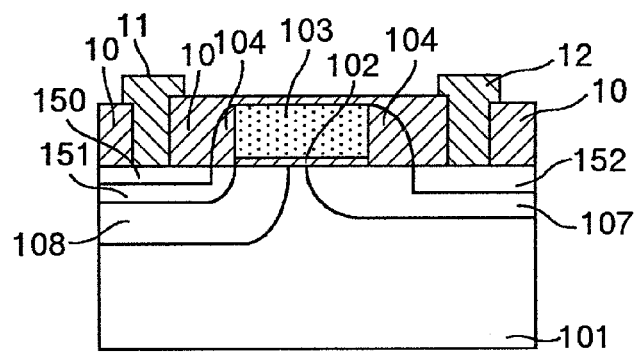

In a step shown in FIG. 7F, N-type impurity ions 205 such as arsenic ions are implanted to form high-density N-type impurity layers 150 and 152, respectively. Now, after deposition of the inter-layer insulation films 10, contact holes are formed with metal films being deposited, whereon the source electrode 11 and the drain electrode 12 are formed by resorting to appropriate process. See FIG. 7G. Incidentally, the contact between the gate electrode and the metal film can be realized through the same process as described hereinbefore in conjunction with the fifth embodiment of the invention.

In the instant embodiment of the invention, both the field relaxation layer 107 and the punch-through stopper layer 108 are formed by resorting to the oblique ion implantation method. However, in the case where the distance between the field relaxation layer and the $N^+$-layer can not be realized by the oblique ion implantation method in view of the relation between the blocking voltage and the gate length, then the window may be formed over a predetermined region by using a photo mask before forming the gate electrode, similarly to the fifth embodiment, whereon ions are implanted to thereby form only the field relaxation layer with the gate electrode being subsequently formed, as in the case of the method according to the fifth embodiment, and then the punch-through stopper layer may be formed by resorting to the oblique ion implantation. Reversely, the punch-through stopper layer may be formed before formation of the gate electrode, and the field relaxation layer may be formed after formation of the gate electrode.

In the foregoing, description has been made of the method of manufacturing the N-type channel MOS field effect transistor. However, the method described above can equally be applied to the manufacturing of the P-type channel MOS field effect transistor.

Embodiment 7

Figure 8A:
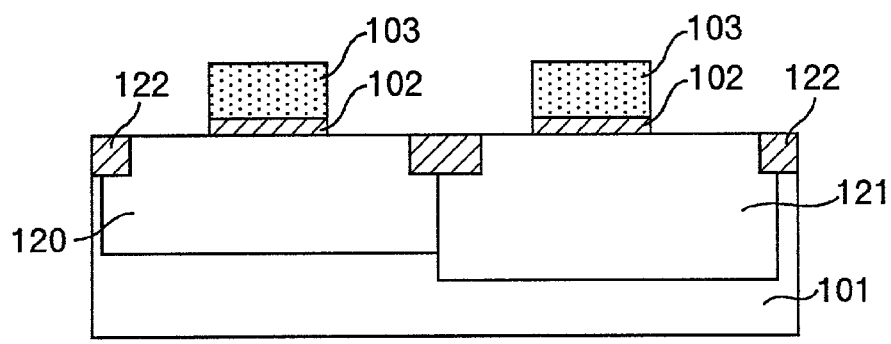

FIGS. 8A to 8E are views showing stepwise a method of manufacturing a semiconductor device in which the N-type channel MOS field effect transistor described hereinbefore in conjunction with the first embodiment of the invention and a P-type channel MOS field effect transistor coexist. Referring to FIG. 8A, a P-type well region 120 for the N-type channel MOS transistor is formed in a P-type silicon substrate or an N-type silicon substrate 101 by implanting P-type impurity ions such as boron ions in a region in which the N-type channel MOS transistor is to be formed, while an N-type well region 121 for the P-type channel MOS field effect transistor is formed in the substrate 101 by implanting N-type impurity ions such as phosphorus ions in a region in which the P-type channel MOS transistor is to be formed. Thereafter, a trench is grooved in the Si-substrate and an insulation film is embedded therein. Thus, a so-called STI (Shallow Trench Isolation) structure is realized by polishing by resorting to a CMP (Chemical Mechanical Polishing) method. Subsequently, gate insulation films 102 and gate electrodes 103 are formed, respectively.

Figure 8B:
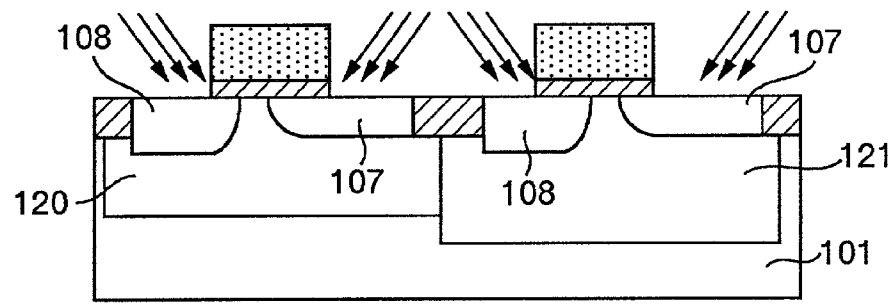

In a step shown in FIG. 8B, a P-type punch-through stopper layer 108 and an N-type field relaxation layer 107 are formed each in the gate overlap structure in the region in which the N-type channel MOS field effect transistor is to be formed by resorting to the photoresist/oblique ion implantation method described previously in conjunction with the sixth embodiment of the invention, while an N-type punch-through stopper layer 108 and a P-type field relaxation layer 107 are formed in the region for forming the P-type channel MOS field effect transistor through the photoresist/oblique ion implantation in the similar manner.

Figure 8C:
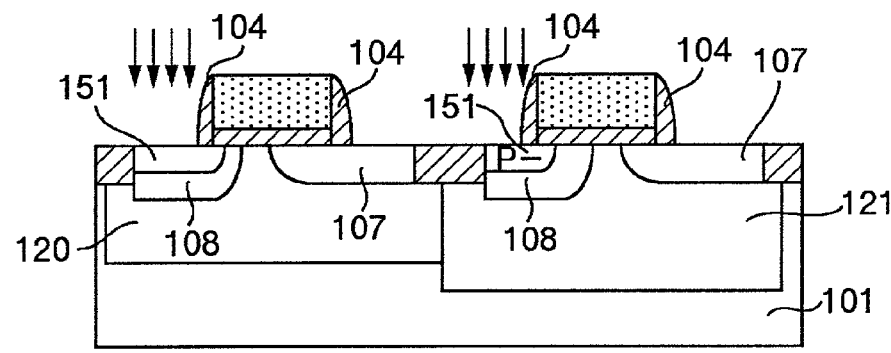

In succession, in a step shown in FIG. 8C, an insulation film is deposited and etch-backed by dry etching to thereby form the side walls 104 of insulation film on the lateral surfaces, respectively, of the gate electrodes.

Figure 8D:
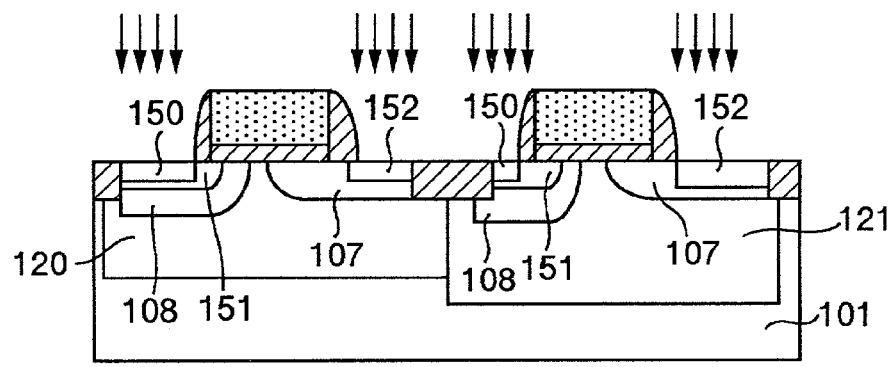

Next, in a step shown in FIG. 8D, N-type impurity ions such as arsenic ions are implanted in the region for forming the N-type channel MOS field effect transistor with the gate electrode and the side walls of the insulation film being used as the mask, while P-type impurity ions such as boron ions are implanted with a high density in the region for forming the P-type channel MOS field effect transistor to thereby form source and drain regions, respectively.

In this manner, the N-type channel MOS field effect transistor and the P-type channel MOS field effect transistor can simultaneously be formed in one and the same substrate.

Embodiment 8

Figure 9:
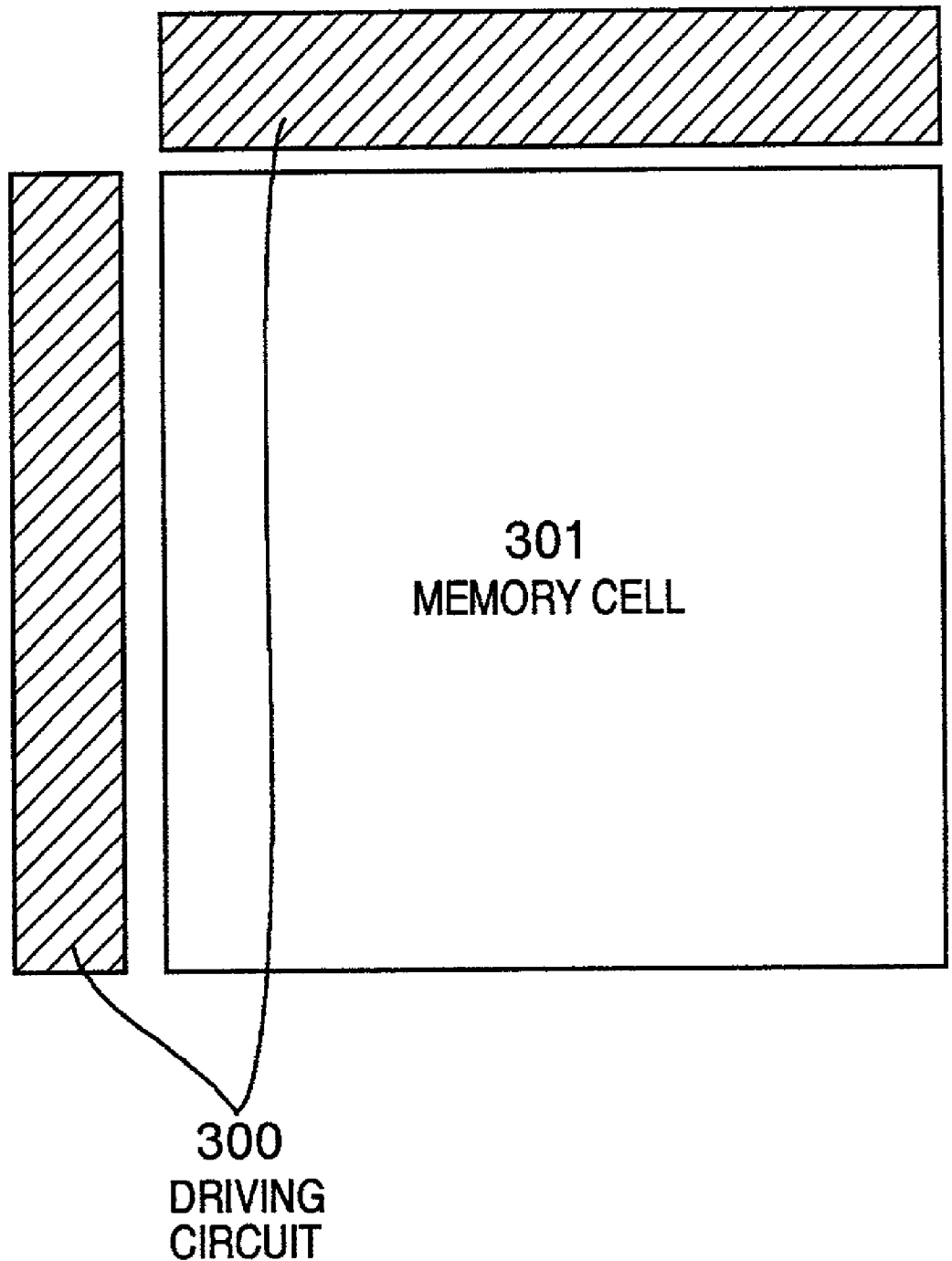
FIG. 9 is a diagram showing a block array in a flash memory system manufactured by making use of the method according to the seventh embodiment of the invention.

FIG. 9 is a diagram showing a block array of a flash memory system. A memory cell 301 is disposed at a center, and driving circuits 300 for executing erasing/writing operations on the memory cell 301 are disposed along sides of the memory cell 301 as indicated by hatched blocks, respectively. The driving circuit 300 is implemented by using the MOS field effect transistors described hereinbefore in conjunction with the first to seventh embodiments of the invention. The chip size of the flash memory system can significantly be reduced because the MOS field effect transistors according to the first to seventh embodiments of the invention can easily be implemented in much miniaturized structure.

In the flash memory system shown in FIG. 9, the driving circuits 300 are disposed at top and left sides, respectively, of the memory cell 301. However, they may be disposed wholly around the memory cell or at some lateral location as well. Of course, the driving circuits 300 may be disposed internally of the memory cell.

As is apparent from the foregoing description, in the MOS field effect transistor according to the present invention, the field relaxation layer is so formed as to overlap the gate electrode from the drain region side while the punch-through stopper layer is formed to overlap the gate electrode from the source region side, wherein the high-density layer is isolated from the gate insulation film so as not to contact the gate insulation film. By virtue of these features, the blocking voltage or voltage withstanding capability of the MOS field effect transistor can be increased and at the same time the gate length can be realized in a much reduced size.

Many modifications and variations of the present invention are possible in the light of the above techniques. It is therefore to be understood that within the scope of the appended claims, the invention may be practiced otherwise than as specifically described.

What is claimed is:

1. A field effect transistor, comprising:
   a semiconductor substrate of a first conductivity type;
   a gate insulation film formed on said semiconductor substrate;
   a gate electrode formed on said gate insulation film;
   a source electrode and a drain electrode formed at lateral sides, respectively, of said gate electrode;
   a source region of a second conductivity type which is in contact with said source electrode;
   a drain region of the second conductivity type which is in contact with said drain electrode;
   a punch-through stopper layer of the first conductivity type formed in contact with said source region at a location deeper than a junction between said source region of the second conductivity type and said semiconductor substrate of the first conductivity type in such a gate overlap structure that said punch-through layer penetrates from beneath an end face of said gate insulation film adjacent to said source electrode toward said drain electrode in contact with said gate insulation film; and
   a field relaxation layer of the second conductivity type formed in contact with said drain region in such a gate overlap structure in which said field relaxation layer penetrates from beneath an end face of said gate insulation film adjacent to said drain electrode toward said source electrode in contact with said gate insulation film;

wherein a high-density layer of the second conductivity type which is in contact with said source electrode and a high-density layer of the second conductivity type which is in contact with said drain electrode are disposed at both sides, respectively, of said gate electrode without being in contact with said gate insulation film.

2. A field effect transistor according to claim 1, wherein said field relaxation layer penetrates from beneath an end face of a gate electrode side wall toward said source electrode for a distance of at least 0.15 μm.

3. A field effect transistor according to claim 1, further comprising:

a layer of the first conductivity type formed on a surface of the field relaxation layer of the second conductivity type and/or alternatively a drain region of the second conductivity type.

4. A field effect transistor according to claim 1, further comprising:

an impurity layer of the first conductivity type or alternatively the second conductivity type formed on a surface of said semiconductor substrate extending beneath said gate insulation film.

5. A field effect transistor, comprising:

a semiconductor substrate of a first conductivity type;

a gate insulation film formed on said semiconductor substrate;

a gate electrode formed on said gate insulation film;

a source electrode and a drain electrode formed at lateral sides, respectively, of said gate electrode;

a source region of a second conductivity type which is in contact with said source electrode;

a drain region of the second conductivity type which is in contact with said drain electrode; and a field relaxation layer of the second conductivity type formed in contact with said drain region in such a gate overlap structure that said field relaxation layer extends from beneath an end face of said gate insulation film adjacent to said drain electrode toward said source electrode in contact with said gate insulation film;

wherein said field relaxation layer penetrates from beneath an end face of a gate electrode side wall toward said source electrode for a distance of at least 0.15 μm.

* * * * *